Figure 1:
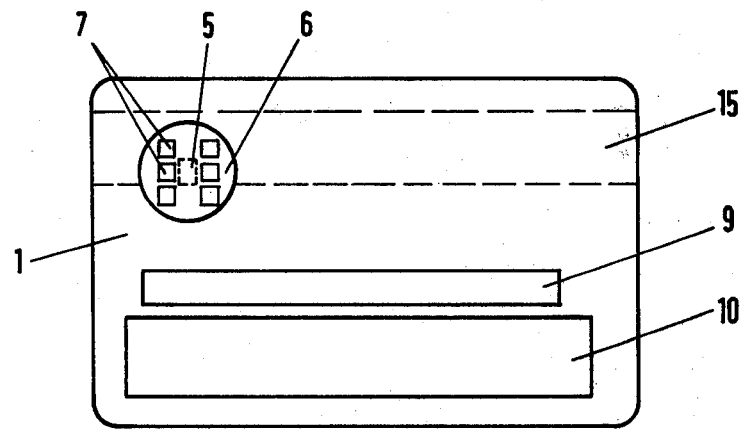

United States Patent [19]

Haghiri-Tehrani et al.

[11] 4,450,024

[45] May 22, 1984

[54] IDENTIFICATION CARD WITH AN IC-MODULE AND METHOD FOR PRODUCING IT

[75] Inventors: Yahya Haghiri-Tehrani; Joachim Hoppe, both of Munich, Fed. Rep. of Germany

[73] Assignee: GAO Gesellschaft für Automation und Organisation mbH, Munich, Fed. Rep. of Germany

[21] Appl. No.: 288,496

[22] Filed: Jul. 30, 1981

[30] Foreign Application Priority Data

Aug. 7, 1980 [DE] Fed. Rep. of Germany ....... 3029939

[51] Int. Cl.³ ............................................... B60J 1/00
[52] U.S. Cl. .................................... 156/108; 156/182; 156/293; 156/295; 156/306.6; 156/309.6; 156/309.9; 156/322; 156/324.4; 264/272.17; 264/279.1; 428/901; 428/916; 283/75
[58] Field of Search ............ 156/182, 322, 295, 331.7, 156/108, 306.6, 293, 309.6, 309.9, 324.4; 264/272.17, 279.1; 428/67, 901, 76, 916, 138; 235/488; 29/831, 841, 577 C; 40/2.2

[56] References Cited

U.S. PATENT DOCUMENTS

| | | | |
|---|---|---|---|
| 3,274,722 | 9/1966 | Kollar et al. | 156/108 |
| 3,411,981 | 11/1968 | Thomas | 156/309.9 |
| 3,417,497 | 12/1968 | Hannon | 40/2.2 |
| 3,811,977 | 5/1974 | Kramer | 156/108 |
| 4,216,577 | 8/1980 | Badet et al. | 264/272.17 |

Primary Examiner—John J. Gallagher
Attorney, Agent, or Firm—Andrus, Sceales, Starke & Sawall

[57] ABSTRACT

An identification card equipped with an integrated circuit, in which the circuit along with its connection leads is arranged on a carrier element which is embeddedly enclosed by the card on all sides by use of the hot lamination technique. In order to protect the sensitive arrangement, the carrier element is subjected to the full laminating pressure only when one or more layers in the card construction have softened.

This is achieved, for example, by providing buffer zones in the card laminate at least in the area of the arrangement in the form of cavities or layers that are easy to deform elastically. The buffer zones protect the arrangement from local pressure peaks in the initial phase of the laminating process. It is also possible to control the laminating pressure as a function of the temperature or the degree of softening of the card layers.

12 Claims, 9 Drawing Figures

U.S. Patent  May 22, 1984  Sheet 2 of 2  4,450,024

IDENTIFICATION CARD WITH AN IC-MODULE AND METHOD FOR PRODUCING IT

The invention concerns an identification card or a similar data carrier with an IC module for the processing of electrical signals, whereby the IC module along with its connection leads is arranged on a separate carrier element which is small in comparison to the identification card. The invention further concerns a method of producing this type of identificatin card.

Identification cards with embedded IC modules have been known for some time. The DE-OS No. 26 59 573, for example, discloses an IC module in which all the connection leads are arranged on a separate carrier plate consisting of rigid material. The carrier plate is glued into an appropriately prepared recess in the card or is connected at the edges with the card by a high-frequency welding process. These methods entail only a slight degree of thermal and mechanical stress for the arrangement, but are elaborate in respect to the card production, since several procedural steps, some of which are technically complicated, must be carried out in the production of the identification card. The incorporation of the carrier element is intended in the case of this known identification card to take place in the so-called embossing area, so that these cards do not meet the usual norms which require the embossing area to be used only for embossings.

The object of the invention thus consists in providing an identification card with an IC module which avoids the above-mentioned disadvantages and can be produced with considerably fewer technical resources.

According to the invention this object is solved through a carrier element laminated into a card composite and connected with the identification card on all sides and over its entire surface. The method of production is characterized in that during the heating phase of the identification card layers the laminating pressure is kept lower than in the final laminating phase, at least in the area of the carrier element.

The invention uses the hot lamination technique, which has been known for some time and is established in practical operation, in order to apply the carrier element provided with the IC module and the connection leads to the card composite in one procedural step during the melting of the various card layers.

The processing of a separate carrier element produced independently of the identification card production in order to produce IC identification cards by using the so-called hot lamination technique proves to be particularly advantageous for this purpose.

The carrier element, which also bears all the connection leads in addition to the integrated circuit, is particularly suited to resist mechanical stress. This is especially true of the stress to which the identification card is exposed in daily use.

The employment of a laminating technique that has been tried out for some time in practical operation allows for the possibility of a rational production of the cards.

Furthermore, hot-laminated identification cards are characterized by an excellent appearance which is due to, among other things, the smooth and highly transparent cover layers of the card. Moreover, hot-laminated identifications cards are very well ensured against forgery, as this technique requires a considerable degree of practical experience and the various layers of a hot-laminated identification card can be separated from each other only by destroying the card.

Identification cards with integrated circuits, for the production of which cards heat and/or heat and pressure are used, are already known (DE-OS No. 22 20 721, DE-OS No. 26 33 164). However, unlike the invention at hand, the identification cards of the publications are based on an entirely different construction of the IC card. The network bonded with the integrated circuit is arranged over a large surface of a middle card layer. In these arrangements the connection points between the network and the IC arrangement are greatly endangered during production of the card as well as during its handling.

The prior publications, which mention the identification card production only in passing, are not oriented towards practical application in respect to the identification card technology. The production techniques are taken over from the usual identification card production, without taking into consideration the specific problems arising in the incorporation of IC modules and their connection leads into identification cards.

However, the DE-OS No. 26 59 573 is the first to deal with the practical problems arising in the production and handling of IC identification cards. It refers to the fact that production by means of a hot lamination technique is not possible as the IC arrangement is too greatly endangered especially by the thermal stress. In order to avoid the difficulties that arise from this, another much more elaborate and technically impractical manner of card production is therefore adopted. Although the arguments raised in the DE-OS No. 26 59 573 against the hot lamination technique were substantiated by a number of experiments, it turned out that the production of IC identification cards by the so-called hot lamination technique is nonetheless possible if special measures are taken to protect the IC module and its connection leads. It also turned out that not only the thermal stress, but also the great mechanical stress during the laminating process can endanger the IC arrangement to the same degree, especially when local pressure peaks appear in the area of the arrangement. This type of stress can break the silicon wafer and/or destroy the junctions of the crystal and the connection leads, which are endangered by the effect of the heat anyway.

The basic idea of the invention consists essentially in applying the full laminating pressure to the carrier element only after one or more layers of the card composite have been softened. This can take place, for example, by providing buffer zones in the card composite before it is laminated, or in the laminating device, which buffer zones keep the full laminating pressure away from the carrier element during the initial phase. A further possibility is to control the laminating pressure as a function of the temperature and/or the degree of softness of the identification card layers. The appearance of local pressure peaks is not possible as the operations according to the invention all involve the full laminating pressure being applied over the entire surface of the material that is already softened or is elastically deformable in a cold state and surrounds the carrier element.

Figure 2A:
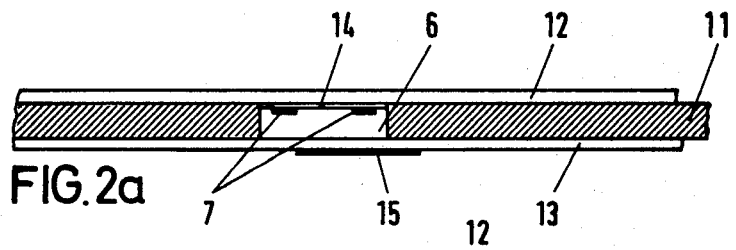
Figure 3A:
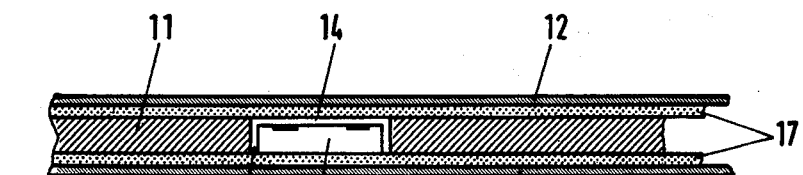
Figure 4A:
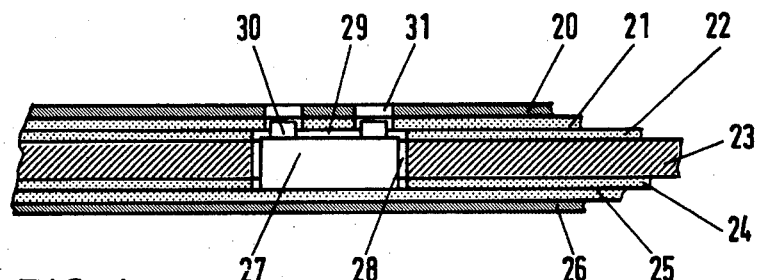
Figure 5A:
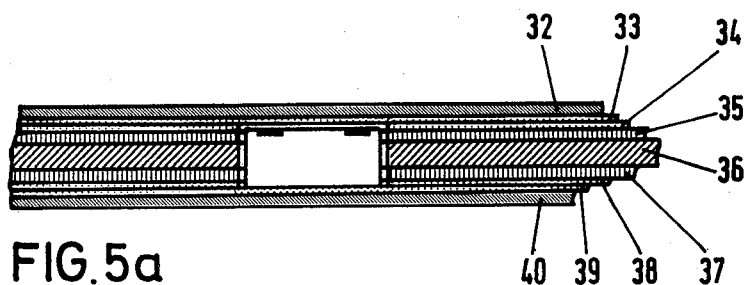

In the following, the embodiments of the invention are described in more detail with reference to the attached drawings. These show:

FIG. 1—the top view of an identification card with an embedded integrated circuit, FIGS. 2a, b—the first embodiment of the card construction before and after lamination in cross-section, FIGS. 3a, b—the second embodiment of the card construction before and after lamination in cross-section, FIGS. 4a, b—the third embodiment of the card construction before and after lamination in cross-section and FIGS. 5a, b—the fourth embodiment of the card construction before and after lamination in cross-section.

FIG. 1 shows an identification card 1 with an embedded IC module 5. The IC module itself is placed in a carrier element 6 which has a disk-shaped construction in the embodiment shown. The contact surfaces 7 are provided for contacting.

The carrier element 6 is produced independently of the card production. The construction of the carrier element, the type of materials employed, the arrangement and construction of the contacts can vary greatly depending on the technical resources and the range of application of the elements in the finished identification card.

The identification card shown in FIG. 1 meets the ISO norm in its dimensions and in the arrangement of further functional areas. Accordingly, the magnetic strip 15 is on the reverse side of the card, as also shown in FIGS. 2a, b.

The fields 9 and 10, respectively, are provided for machine-readable and non-machine-readable embossed data.

FIG. 1 shows an advantageous arrangement of the carrier element 6 outside the embossing fields 9 and 10, respectively, in an area of the card subjected to little stress.

The embodiments described in the following show by way of example by what means local pressure peaks can be kept away from the carrier element, although the whole card composite, including the area in which the carrier element is arranged, receives the full laminating pressure at least in the final phase of the laminating process.

It is thus possible to produce identification cards with an integrated circuit with the quality of usual hot-laminated cards without endangering the circuit and its connection leads.

Figure 2B:
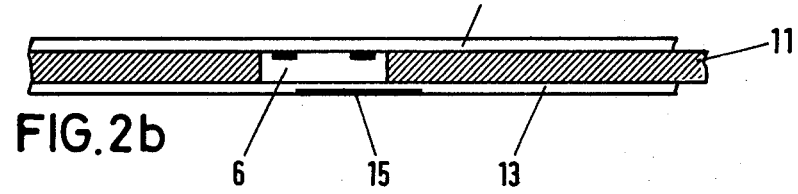

FIGS. 2a and 2b show the first embodiment of the invention before and after the laminating process. The proportions of the various elements of the card are not always shown in correct scale in this and the following embodiments, for the sake of clarity.

The simple card composite shown in cross-section consists of a—possibly many-layered and printed—card core or card bed 11 and the cover films 12 and 13. The card core and the cover films can consist of PVC (polyvinyl chloride). Paper can also be used as a card bed. The card bed is provided with a closely fitted recess to accept the carrier element 6. The thickness of the card bed is chosen relative to the thickness of the carrier element 6 in such a way that a cavity 14 results in the unlaminated card composite between the surface of the carrier element and the cover film 12.

The carrier element is only subjected to little stress in the initial phase of the laminating process due to the buffer zone formed by the cavity 14. In the further course of the laminating process the card composite is gradually heated up so that the PVC-layers soften. In the softening phase of the layers the cavity 14 disappears and the full laminating pressure now also takes effect in the area of the carrier element 6. In this phase the softened layers form a cushion which keeps local pressure peaks away from the carrier element.

As shown in the laminated card composite (FIG. 2b), the carrier element 6 is connected with the identification card 1 on all sides and over its entire surface, i.e. it is laminated in. In the process a magnetic strip 15, if required, is embedded in the film material in such a way that a smooth surface also results in the area of the magnetic strip.

The contacts or coupling elements 7 are covered in the embodiment by the film 12. This embodiment is thus suitable for indirect (contactless) contacting (e.g. capacitive or optical). If the energy transfer is to take place optically, the cover film 12 should be constructed so as to be transparent in the area of the coupling elements 7 according to the type of light employed. When IR (infrared) light is employed, the cover film can be blackened in the area of the carrier elements, so that stray light is simultaneously kept away from the IC arrangement.

In principle direct contacting can also be carried out, if, for example, the cover layer 12 is pierced for contacting with appropriate contact elements.

Figure 3B:
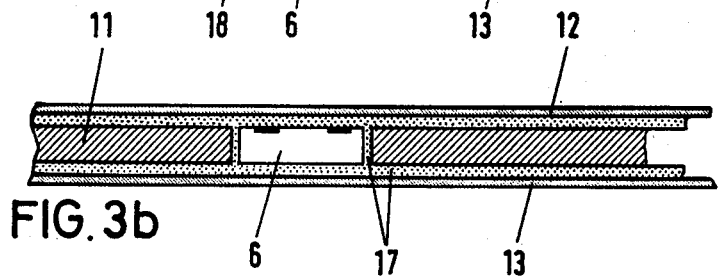

FIGS. 3a and 3b show the second embodiment of the invention, in which one or more buffer zones are formed by intermediate layers in the card composite, for example by a so-called laminating adhesive. For this purpose the cover films 12 and 13 are coated with the laminating adhesive 17 before the laminating process (FIG. 3a).

Adhesive suitable for this purpose (e.g. polyurethane hotmelt adhesive) should be elastic at normal temperature and have a softening temperature below that of the cover layers chosen for the card composite.

In the above-mentioned embodiment the recess of the card core 11 is punched with a diameter larger than that of the carrier element 6. Thus a free gap 18 arises around the carrier element 6, in addition to the cavity 14 shown in FIG. 2a. The recess need not in this case be fitted to the carrier element within such narrow limits as in the arrangement shown in FIG. 2a.

The carrier element is hardly subjected to any stress in the initial phase of the laminating process in the card construction shown in FIG. 3a either. As soon as the laminating temperature reaches the softening temperature of the adhesive 17 and finally surpasses it, the laminating adhesive 17 flows into the cavities 14 and 18 and thus forms a homogeneous casing for the carrier element 6.

The carrier element thus protected from local pressure peaks can now accept the full laminating pressure over its area and transfer it to the surroundings. In the meantime the cover films have also reached the softening temperature so that finally an intimate composite of all layers with each other and with the carrier element which is closed in on all sides, results.

In the complete laminated identification card (FIG. 3b) the carrier element 6 is surrounded by the adhesive 17 which is elastic in a cold state and keeps the mechanical stress arising in the daily use of the card away from the carrier element to a considerable degree.

Polyurethane can be processed not only as a fusion adhesive, but also in the form of a fusion adhesive film in the card composite. If a very soft polyurethane fusion adhesive film (e.g. platilon U02-TM Plate Bonn GmbH) is used in the card composite, it is possible to choose the thickness of the various card layers relatively to the thickness of the carrier element within such limits so as to make the cavity 14 very small or completely disappear, if need be. A very soft fusion adhesive film is able to accept local pressure peaks to a certain degree, even when the card composite is in a cold state. When the film softens the laminating process then proceeds as described above.

Figure 4B:
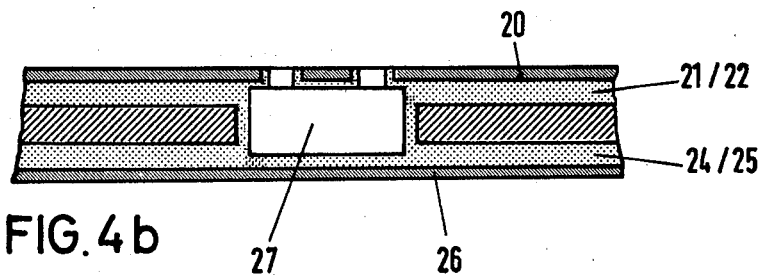

FIGS. 4a and 4b show the third embodiment of a card construction according to the invention, in which the buffer zones are formed by using, among other things, compound films.

The arrangement shown in FIG. 4a shows the construction of the card layers before lamination.

The many-layered card core consists of a paper layer 23 and the films 22 and 24 arranged on both sides of this layer. These films consist of the thermoplastic material polyethylene (PE). PE can be varied within broad ranges as far as its mechanical and thermal qualities are concerned depending on its density. PE with low density is, unlike PVC, relatively soft while having great plastic deformability and a low softening point.

In the extended card core a recess is punched depending on the diameter of the carrier element 27, which recess leaves a gap free all around the carrier element. The thickness of the various layers of the card core is chosen relative to the thickness of the carrier element 27 in such a way that a cavity 29 also remains between the carrier element and the cover layers 21 and 22 next to it. The cover layers 20, 21 and 25, 26 consist of polyethylene-coated polyvinyl chloride films which are processed as compound films. The upper cover layer 20, 21 is provided with appropriate recesses 31 to conduct the contacts 30 of the carrier element 27.

In a cold state the carrier element 27 is hardly affected by the pressure of the laminating plate due to the selected layer construction. In the course of the laminating process the PE layers are first subjected to the flow phase so that the cavities 28, 29 are filled up with the PE material. The casing protects the carrier element from local pressure peaks during the high pressure necessary in the final phase of lamination and also provides good protection against mechanical deformation in the daily use of the card.

In the embodiment of an IC identification card shown in FIG. 4b, the contacts of the carrier element 27 are directed to the surface of the cover layer, so that in this case direct contacting is possible.

Figure 5B:
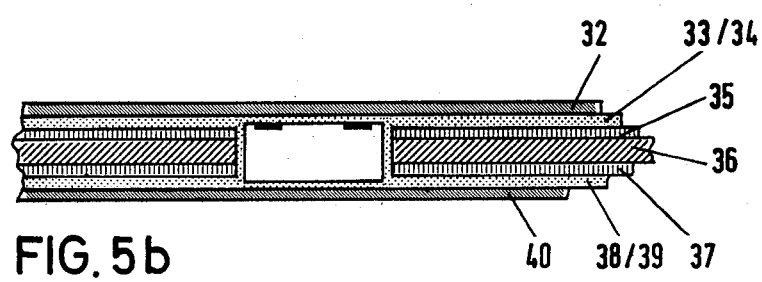

FIGS. 5a and 5b show a fourth embodiment of the invention, in which only so-called compound films are used to form the buffer zones.

The compound films used in this example as cover layers are polyester films (PETP) 32 and 40, respectively, which are coated with polyethylene (PE) 33 and 39, respectively. The symmetrically adjacent second compound films consist of PE 34, 38 and PVC 35, 37. The card core itself 36 can consist optionally of PVC or paper due to this special card construction.

FIG. 5b shows the identification card after the laminating process, which can proceed as explained in connection with FIGS. 4a, 4b. As mentioned, the cover films of this identification card consist of a special polyester.

PETP (polyethylene glycol terephthalate) is a thermoplastic polyester with very great rigidity, great abrasive resistance, little tendency to contract and a high softening point. These films are thus especially well suited for identification cards that are exposed to great stress in daily use.

As the polyester films employed have only little tendency to contract, unlike, for example, PVC films, it is possible to heat the card composite at first without using pressure, until the PE layers go into the flow phase. The card compound softened in this way is then pressed together under pressure. The card layers that have been softened in a heating unit can thus subsequently be pressed together e.g. with the help of two rollers, by the so-called roller lamination technique.

In the above embodiments buffer zones are provided in the layer construction of the card composite to protect the carrier element.

It is, however, also possible to provide the carrier element itself with a buffer zone over its entire surface or only partially—before lamination. Usable materials, their properties and their behavior during the laminating process have been mentioned in connection with the description of FIGS. 3a and 3b. The carrier element could be dipped in an appropriate resin for a casing of its entire surface.

If the carrier element itself consists of rigid material, a partial coating of the element can, for example, be provided by covering the contact side with a fusion adhesive film as a buffer zone.

A further possibility of protecting the carrier element from local pressure peaks during lamination consists in coating the laminating plates with a soft, flexible material at least in the area of the carrier element. Silicon rubber is, for example, appropriate for this purpose.

Finally it is also possible to protect the carrier element against local mechanical stress during incorporation into identification cards, if the laminating pressure is adjusted as a function of the temperature. In this case the contracting tendency of the film type employed must be taken into consideration, as it rises with the temperature.

The laminating pressure will thus be increased as a function of the temperature in such a way that the films involved do not warp, but on the other hand the carrier element is subjected to the full laminating pressure in the final phase of the laminating process, after the card layers have softened. By use of the method of controlling the laminating pressure as a function of the temperature, integrated circuits can be embedded in identification cards undangerously, without any need of additional measures.

On the other hand, it may prove useful for certain cases of application, e.g. the processing of films with a great contracting tendency, to combine the method of controlling the laminating pressure with one or more of the above-mentioned protective measures.

What is claimed is:

1. A method for producing a multi-layer identification card having an IC-module for processing electrical signals, the IC-module with its connection leads being arranged on a separate carrier element that is small relative to the identification card, said method avoiding localized pressures on the carrier element during production of the card and comprising the steps of:
   providing an identification card assembly including an internal layer having a recess for the carrier element and at least one covering layer heat sealable to the internal layer, at least one of said layers being thermally softenable;
   inserting the carrier element in the recess;
   before or after inserting the carrier element in the recess, establishing a buffer proximate to the carrier element for limiting the application of force to the carrier element prior to thermal softening of the card layer; and applying heat and pressure to the identification card assembly to heat seal the layers together, said buffer limiting the application of force to the carrier element prior to softening of the thermally softenable layer to avoid localized pressure on the carrier element.

2. The method as in claim 1 wherein the step of establishing the buffer is further defined as forming the recess in the internal layer of the identification card assembly to provide spacing between at least one of the layers and the carrier element prior to the softening of the thermally softenable layer.

3. A method as in claim 2 wherein the step of establishing the buffer is further defined as providing an additional card layer intermediate the internal layer and covering layer having a lower thermal softening point than that of the covering layer or internal layer.

4. A method as in claim 2 wherein the step of establishing the buffer is further defined as at least partially encasing the carrier element in a material having a thermal softening point lower than that of the covering layer.

5. A method as in claim 1 wherein the step of establishing the buffer is further defined as providing an elastic means intermediate the carrier element and at least one of the layers to which pressure is applied.

6. A method as in claim 5 wherein the step of establishing the buffer is further defined as at least partially encasing the carrier element in an elastic material.

7. A method as in claim 5 wherein the step of establishing the buffer is further defined as forming the buffer by incorporating an elastic layer in the identification card assembly.

8. A method as in claim 5 further defined as providing an elastic means intermediate the carrier element and layer that has a higher degree of elasticity in the unheated state than the layers of the card assembly.

9. A method as in claim 1 further defined as controlling the pressure applied to the assembly as a function of the temperature of the assembly.

10. A method as in claim 1 further defined as controlling the pressure applied to the assembly as a function of the amount of softening of the thermally softenable layer.

11. A method as in claim 2 further defined as applying the heat to the identification card assembly and thereafter applying pressure to the assembly.

12. A method as in claim 7 wherein the step of establishing the buffer is further defined as forming the buffer as an elastic coating on one of the layers of the card.

* * * * *